US005694443A

United States Patent [19]
Stone et al.

[11] Patent Number: 5,694,443
[45] Date of Patent: Dec. 2, 1997

[54] APPARATUS FOR COUNTING ELECTRONIC COMPONENTS

[75] Inventors: Jeffrey L. Stone; Michael J. Zelinski; Thomas M. Wappes; James H. Ihrke; Char L. Brown; Tony D. Foster, all of Rochester; Gerald F. Simon, Oronoco, all of Minn.

[73] Assignee: International Business Machines Corporation, Armonk, N.Y.

[21] Appl. No.: 749,173

[22] Filed: Nov. 14, 1996

[51] Int. Cl.⁶ .................................................. G06M 7/00
[52] U.S. Cl. ............................................................. 377/6
[58] Field of Search ................................................ 377/6, 8

[56] References Cited

U.S. PATENT DOCUMENTS 5,041,721  8/1991  Smith et al. ............................ 377/6
5,533,079  7/1996  Colburn et al. ........................ 377/6

*Primary Examiner*—Margaret Rose Wambach
*Attorney, Agent, or Firm*—Andrew J. Dillon

[57] ABSTRACT

The present invention includes a component feeder having a portable frame that is adapted to be moved between, and installed at, a plurality of assembly machines in which the portable frame is adapted to receive a reel containing a roll of tape with components mounting on the roll of tape. The component feeder also includes a component advancing mechanism mounted on the portable frame, wherein the component advancing mechanism is adapted to advance the roll of tape by one of the components. A counter in the component feeder is mounted on the portable frame and electrically connected to the component advancing mechanism, wherein the counter detects and counts each advancement of the roll of tape.

14 Claims, 3 Drawing Sheets

APPARATUS FOR COUNTING ELECTRONIC COMPONENTS

BACKGROUND OF THE INVENTION

1. Technical Field

The present invention relates generally to dispensing of electronic components using an electronic feeder and in particular to a method and apparatus for taking inventory of electronic components. Still more particularly, the present invention relates to a method and apparatus for counting electronic components dispensed from an electronic feeder.

2. Description of the Related Art

Businesses engaged in manufacturing are constantly presented with the need to determine the inventory of parts currently available for production of complicated machinery and electrical apparatus. Miniaturization of electronic circuits and parts in the electronics and electrical-mechanical arts has evolved to the point where many of the parts used in devices such as miniature calculators, computers, watches, and similar devices employing computer memory storage chips, diodes, and similar elements are difficult to store and handle when the parts are in inventory or are being used in conjunction with a mass production line utilizing a large supply of components.

Many of the electrical parts, as an example, are so tiny that they are stored on tapes, which are then rolled onto supply reels for handling. The microprocessor or other small parts may be encapsulated on the surface of a storage tape by providing a cavity on the storage tape over which another tape is placed in order to capsulate or capture the tiny part and protect the parts from damage or destruction.

Many of these parts are individually very tiny, but also quite valuable. Consequently, a manufacturer, must for tax reasons and future production reasons, keep a running account of the number of such parts in inventory. The physical problem of handling the total number of such tiny parts is extremely difficult from a bulk handling point of view. As a result, the encapsulating storage tapes become a useful method for maintaining these parts in inventory. The tapes protect the pads and provide a supply reel of sufficient size for handling by employees. On the other hand, such storage complicates the problem of counting parts for the purpose of identifying a total number of such parts in inventory. Furthermore, the small size of these parts becomes a burden when the parts are placed on a manufacturing line, where they are used at a rapid pace. Also, it is imperative that during the process of manufacturing, that the assembly operation maintain a running inventory of parts available to the manufacturing process at all times. Many electronic units contain literally thousands of tiny parts for inclusion in a single finished electrical unit. If one of these parts is exhausted during the manufacturing process, then the entire manufacturing line may be shut down until the exhausted parts can be replaced. Consequently, a manufacturer is burdened with the problem of keeping a "running inventory" of the number of parts available during the continuous manufacturing of larger electrical units.

A variety of methods have been used to track the storage inventory and the manufacturing inventory of small parts. Some inventory systems rely on weight as a way of measuring the total number of small items in inventory. Each unit has a known weight, which can be used to calculate the number of units from a total weight of a bulk container of such small units. The disadvantage of this weight determination system is that expensive electronic scales must be used to make the weight checks. Furthermore, these electronic scales are subject to variations in weight measured and therefore must be constantly recalibrated. Also, weight counting systems are not particularly useful and efficient in a continuous manufacturing process and some of these systems have variations caused by heat, dust, and other environmental conditions which would tend to give an erroneous weight calculation and thus resulting in an erroneous calculation as to the number of tiny parts in inventory.

In other operations, parts are stored in packages with a finite number of parts per package. For example, resistors may be stored in packages of 50 units per styrofoam package. These storage units are adequate for the purpose of storing the components, but are difficult to integrate into a continuous manufacturing system with an attendant counting system designed to load operators of continuous manufacturing processes of the current status of the inventory supply on the manufacturing line.

Other methods require the feeder holding the reel of tape be mounted in an assembly machine so that the machine's software can monitor the reel's inventory or that the reel be removed from the feeder to be counted on a counting machine. This method severely limits flexibility in manufacturing by not allowing the feeder to move from machine to machine or to be removed from the machine at all. The second method of counting the components on a separate machine requires additional time for set up and tear down in manufacturing and possible loss of components.

Therefore, it would be advantageous to have an improved apparatus that allows for counting of inventory on a tape while allowing the reel to remain on the feeder and allow for the feeder to be moved freely from machine to machine.

SUMMARY OF THE INVENTION

It is one objective of the present invention to provide an apparatus for dispensing electronic components using an electronic feeder. It is another object of the present invention to provide a method and apparatus for taking inventory of electronic components.

It is yet another object of the present invention to provide a method and apparatus for counting electronic components dispensed from an electronic feeder.

The present invention includes a component feeder having a portable frame that is adapted to be moved between, and installed at, a plurality of assembly machines in which the portable frame is adapted to receive a reel containing a roll of tape with components mounting on the roll of tape. The component feeder also includes a component advancing mechanism mounted on the portable frame, wherein the component advancing mechanism is adapted to advance the roll of tape by one of the components. A counter in the component feeder is mounted on the portable frame and electrically connected to the component advancing mechanism, wherein the counter detects and counts each advancement of the roll of tape.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

Figure 1:
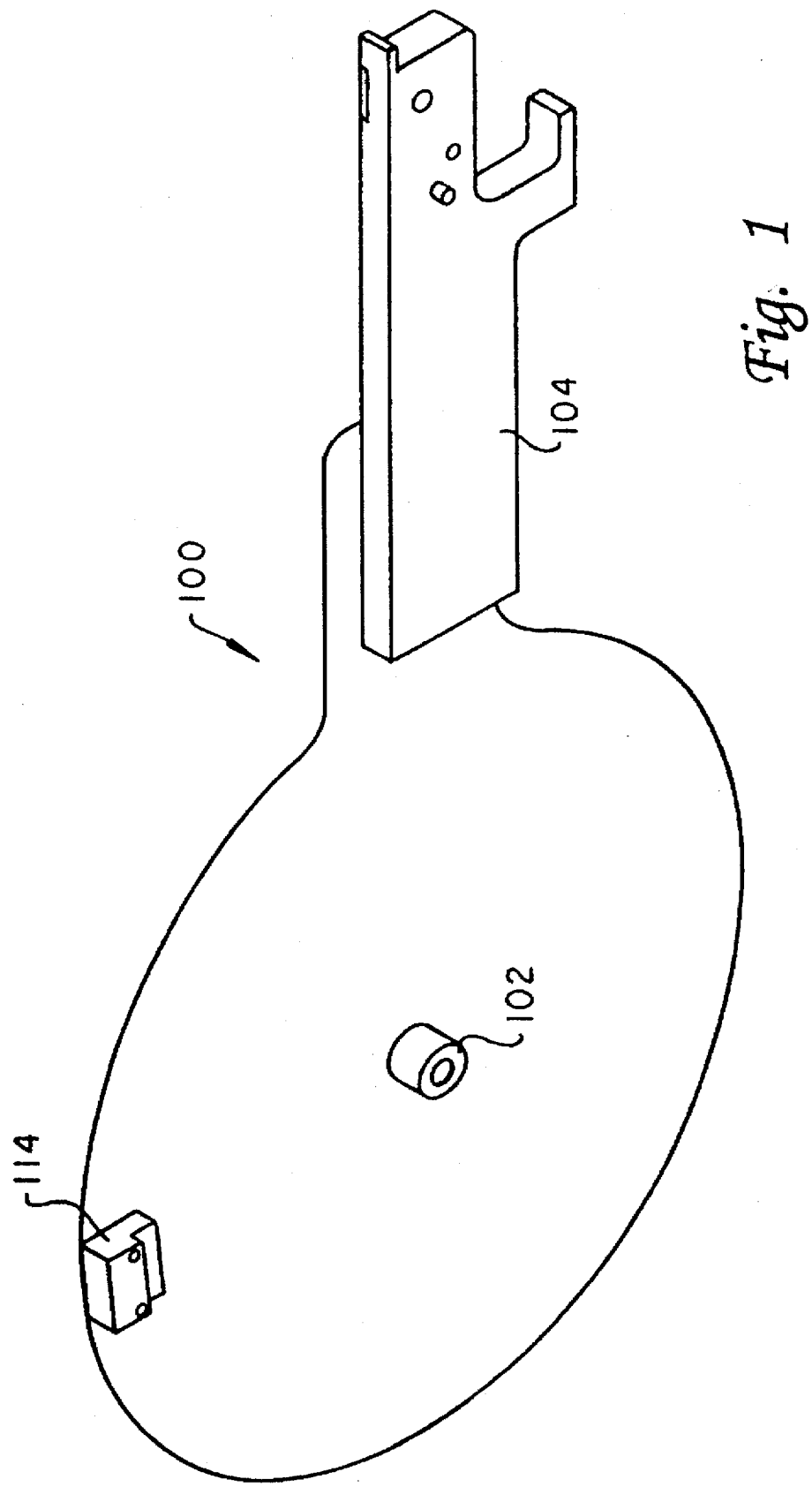
FIG. 1 is a front view of a component feeder in accordance with a preferred embodiment of the present invention.
Figure 2:
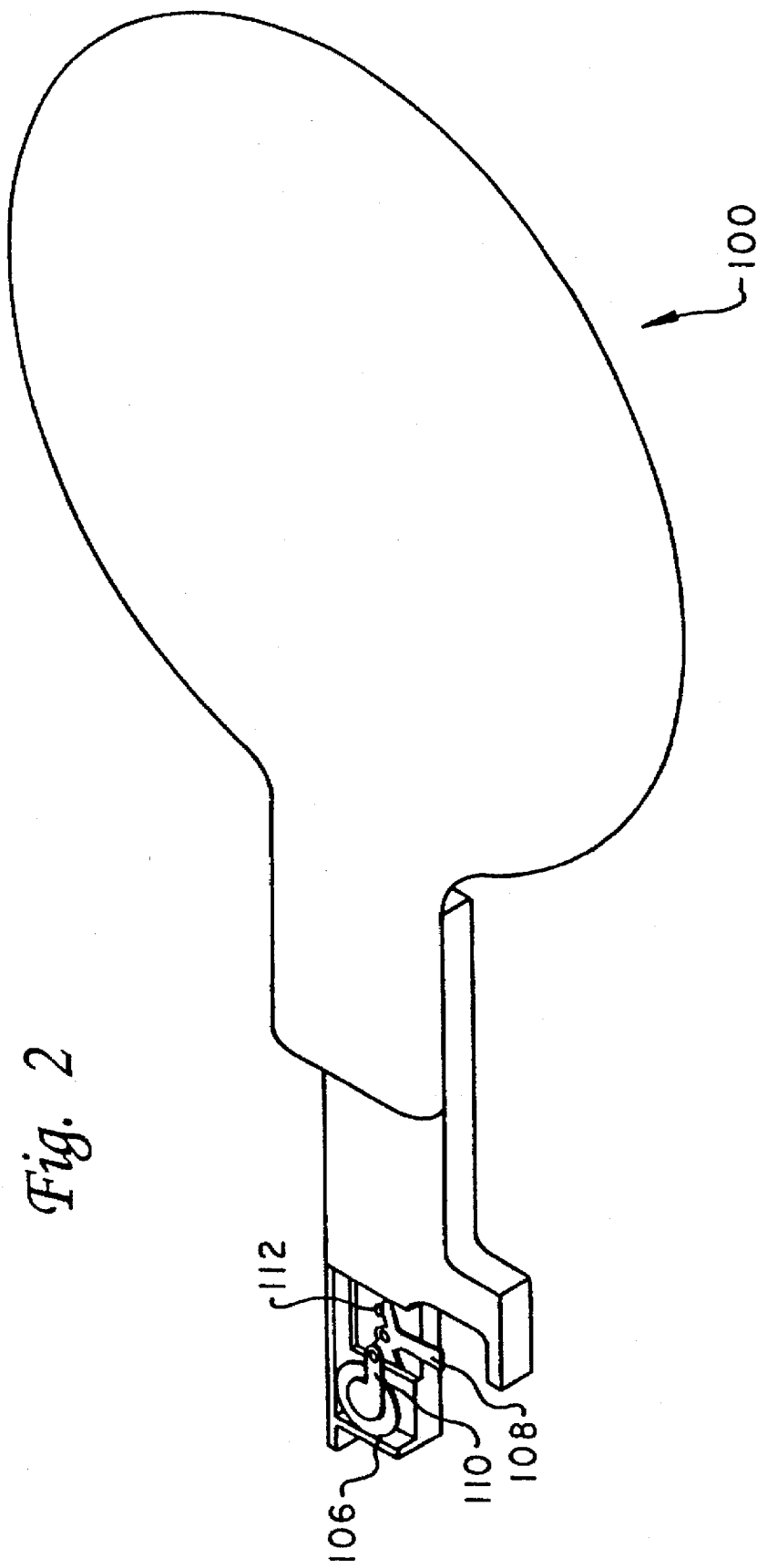
FIG. 2 depicts a back view of component feeder in accordance with a preferred embodiment of the present invention.

With reference now to the figures, and in particular with reference to FIGS. 1 and 2, diagrams of a component feeder 100 is depicted in accordance with a preferred embodiment of the present invention. Component feeder 100 includes a spindle 102, which is adapted for receiving a component reel for holding carrier tape on which electronic components are mounted. Tape track 104 is employed to guide the carrier tape from the reel to ratcheting pitch wheel 106 as illustrated in FIG. 2. FIG. 1 illustrates a front view of a component feeder while FIG. 2 depicts a back view of the feeder in accordance with a preferred embodiment of the present invention.

Figure 3:
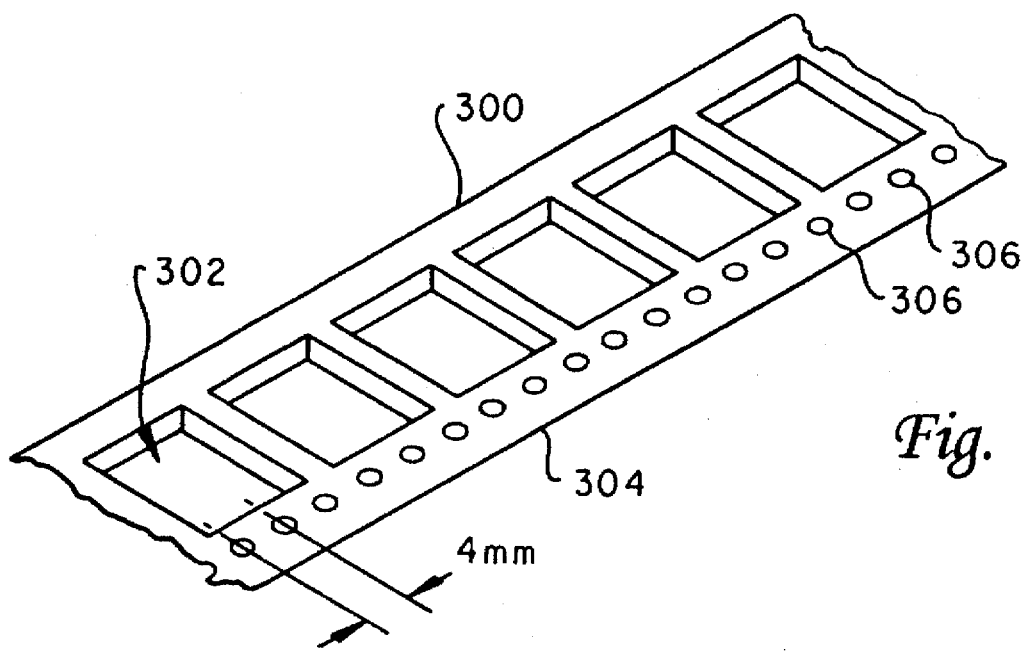
FIG. 3 is an illustration of a carrier tape used with a component feeder in accordance with a preferred embodiment of the present invention.

Carrier tape 300 in FIG. 3 includes component pocket 302, which is employed for carrying electronic components in accordance with a preferred embodiment of the present invention. Perforated edge 304 includes holes 306, which are 4 mm apart from each other in the depicted example. Additionally, a constant pitch in the perforated edge, which may be found on one side or both sides of carrier tape 300. With reference to FIG. 2, actuating lever 108 is employed to advance the carrier tape through linkage 110 to ratcheting pitch wheel 106. Each actuation of actuating level 108 advances the carrier tape by a predetermined amount (a multiple of 4 mm in the depicted example). At the end of tape track 104, an electronic component on the carrier tape is presented for placement by the assembly machine, which will take the component and place it on to a circuit board.

Actuating lever 108 may be actuated either by an assembly machine or a person to advance the carrier tape by a predetermined amount. When actuating lever 108 returns to its original position, actuating lever 108 makes contact with a stop pin 112, which is electrically isolated from the rest of component feeder 100. The remainder of component feeder 100 forms an electrical conductor similar to a frame ground in an automobile. Stop pin 112 is electrically connected to one terminal of a battery powered LCD counter 114. The other terminal of counter 114 is electrically connected to feeder mechanism 100. Counter 114 may be implemented in a number of ways in accordance with a preferred embodiment of the present invention. In the depicted example, an Eagle self-powered counter available from Redington Counters, Inc. in Windsor, Conn. may be employed, which requires no external power and self-powered by a 20-year lithium battery. When actuating lever 108 and stop pin 112 make contact, the circuit is completed and counter 114 increments or decrements the count. In accordance with a preferred embodiment of the present invention, counter 114 may be incremented to indicate the number of components used. Alternatively, counter 114 may be set at the number of components located on the component reel and indicate the number of components left on the reel. If multiple lever actuations (i.e., N) are required to advance the carrier tape by one component position, a "divide by N" counter may be employed.

Figure 4:
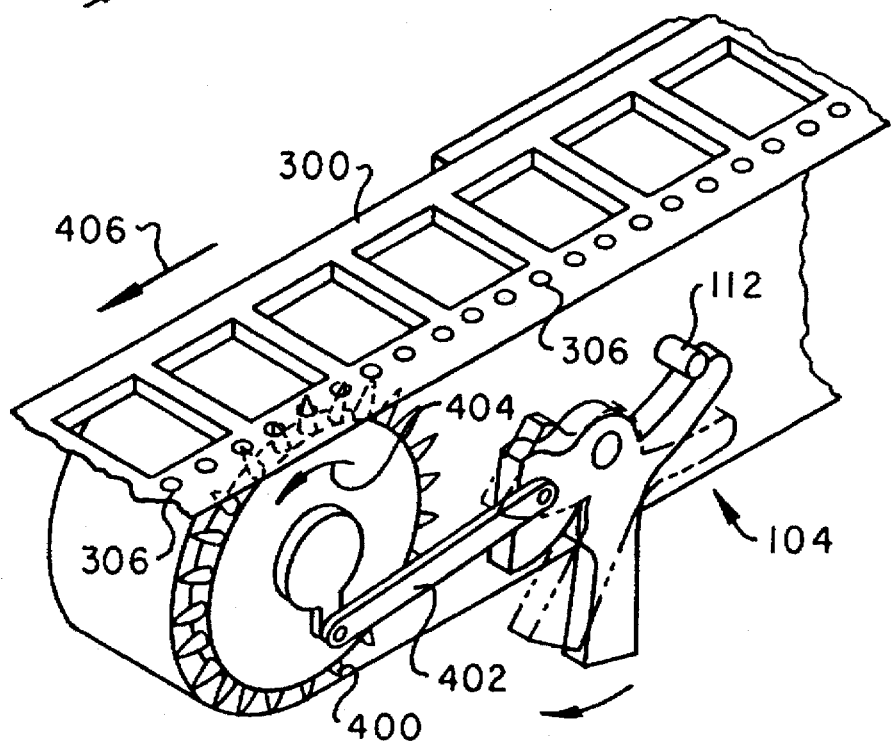
FIG. 4 is a front perspective view of a tape track in a component feeder in accordance with a preferred embodiment of the present invention.

Turning now to FIG. 4, a front perspective view of a tape track is depicted in accordance with a preferred embodiment of the present invention. Tape track 104 includes a pitch wheel 106 engages carrier tape 300 using teeth 400 to engage holes 306 in carrier tape 300. Actuating lever 108 is connected to pitch wheel 106 by linkage 110. As can be seen, actuating lever 108 makes contact with stop pin 112, which is electrically isolated from the rest of the component feeder. As can be seen, actuating lever 108 can be moved from a first position, in contact with stop pin 112 to a second position, which results in pitch wheel 106 rotating in the direction of arrow 404 to advance carrier tape in the direction of arrow 406. As the carrier tape is advanced, the counter is incremented to indicate the number of components used. Electrical contact is again made when actuating lever 108 returns to the first position where actuating lever 108 is in contact with stop pin 112. This electrical connection and disconnection of actuating lever 108 with stop pin 112 completes and opens a circuit, which causes the counter to increment or decrement the count depending on the implementation.

A preferred embodiment of the present invention may be made using the following components: 1 Redington Eagle Self-Powered Digital Counter (p/n 5300-0000); 1 SMT placement machine tape feeder available from Universal Instruments in Binghamton, N.Y.; 1 right angle mounting flange (1.5"×1.5"×0.125" thick×2.125" long with 0.890"(+/−0.010")×1.790"(+/−0.010") cut out); 2 #8-32×0.250" UNF screws (or equivalent); 2 #8-32 hex nuts (or equivalent); 2 crimp-on ring terminals (or equivalent); a plastic bushing; and 24" 20 AWG insulated wire. Two clearance holes are drilled through the counter mounting flange in the Redington Eagle Self-Powered Digital Counter on the section without cutout for the two #8-32 UNF screws. The clearance hole pattern is transferred from a mounting flange to the SMT placement machine tape feeder at the reel holder section. Two clearance holes are drilled through the reel holder portion of the tape feeder for the #8-32 UNF screws. Thereafter, the counter mounting flange is mounted to the feeder at the reel holder section and secured with one of the two #8-32 UNF screws and a matching hex nut (#8-32 hex nut). The counter is then mounted through the cutout in the flange with the digital readout facing up away from the tape feeder and then secured from the rear portion with a counter mounting clip. The stop pin is removed from the tape feeder and an oversize hole is formed for the stop pin. A plastic bushing is placed in the oversize hole to provide electrical isolation from the frame of the tape feeder. A section of wire is cut and insulation is stripped from the ends with a crimp-on ring terminal placed on one end. The wire free stripped end of the wire is coupled to terminal 2 of the Redington Eagle Self-Powered Digital Counter and then the stop pin is inserted into the plastic bushing and a crimp-on ring terminal end of the wire is coupled to the stop pin with a metal washer and hex nut. Thereafter, the insulation is stopped from both ends of the remaining length of wire and a crimp-on ring terminal is crimped to one end. The exposed wire at the stripped end of the wire is coupled to terminal 3 and the remaining #8-32 UNF screw is inserted through the ring terminal and the wire and through the counter mounting flange. The screws are secured to the mounting flange and reel holding section of the tape feeder with a matching hex nut. Thereafter, the electrical wires are routed and secured to form the component feeder 100 depicted in FIGS. 1–2 and 4. The process described is a process for retrofitting an existing SMT placement machine tape feeder. Of course, the present invention may be created from an original design or other types of retrofits may be employed to provide the features of the present invention.

Thus, the present invention solves the problem of inventory monitoring and control of assembly components packaged in a tape reel format. In particular, the counter remains with the component feeder and may be moved from machine to machine without having to reset a counter used at the machine to determine how may components are left in the component feeder. The present invention provides the advantage of portability of the counter by using the component feeder itself to generate the signals that increase or decrease the counter.

The description of the preferred embodiment of the present invention has been presented for purposes of illustration and description, but is not intended to be exhaustive or limit the invention in the form disclosed. Many modifications and variations will be apparent to those of ordinary skill in the art. The embodiment was chosen and described in order to best explain the principles of the invention and the practical application to enable others of ordinary skill in the art to understand the invention for various embodiments with various modifications as are suited to the particular use contemplated.

What is claimed is:

1. A component feeder comprising:
    a portable frame adapted to be moved between, and installed at, a plurality of assembly machines, wherein the portable frame is adapted to receive a reel containing a roll of tape and wherein a plurality of components are mounted on the roll of tape;
    a component advancing mechanism mounted on the portable frame, wherein the component advancing mechanism is adapted to advance the roll of tape by one of the plurality of components, resulting in an advancement of the roll of tape; and
    a counter mounted on the portable frame and electronically connected to the component advancing mechanism, wherein the counter detects and counts each advancement of the roll of tape.

2. The component feeder of claim 1, wherein the counter counts the advancement of the roll of tape by incrementing a value in the counter.

3. The component feeder of claim 1, wherein the counter counts the advancement of the roll of tape by decrementing a value in the counter.

4. The component feeder of claim 3, wherein the value is initially set equal to the plurality of components on the roll of tape.

5. The component feeder of claim 3, wherein the value is initially set equal to zero.

6. The component feeder of claim 1, wherein the counter includes a first terminal and a second terminal and wherein the component includes:
    a stop pin; and
    an actuating lever contacting the stop pin in a first position and advancing the tape by one of the plurality of components when moved to a second position from the first position, wherein the actuating lever returns to the first position after one of the plurality of components has been advanced, the actuating lever is electrically connected to the second terminal, and moving the actuating lever from the first position to the second position and back to the first position sends an electronic signal to the counter used to count the advancement of the roll of tape.

7. The component feeder of claim 1, wherein the counter includes a first terminal and a second terminal and wherein the component feeder includes:
    a stop pin, wherein the stop pin is electrically isolated from other portions of the component advancing mechanism and is electrically connected to the first terminal of the counter; and
    an actuating lever contacting the stop pin in a first position and advancing the roll of tape by one of the plurality of components when moved to a second position, wherein the actuating lever returns to the first position after one of the plurality of components has been advanced, wherein the actuating lever is electrically connected to the second terminal, and wherein moving the actuating lever from the first position to the second position and back to the first position sends an electronic signal to the counter used to count the advancement of the roll of tape.

8. A component feeder comprising:
    a portable frame adapted to receive a reel containing a roll of tape and wherein a plurality of components are mounted on the roll of tape;
    advancing means for advancing the roll of tape by one of the plurality of components resulting in an advancement of the roll of tape; and
    counting means, mounted on the portable frame and responsive to the advancing means advancing the roll of tape by one of the plurality of components, for counting each advancement of the roll of tape.

9. The component feeder of claim 8, wherein the counting means counts the advancement of the roll of tape by decrementing a value in the counter.

10. The component feeder of claim 8, wherein the counter counts the advancement of the roll of tape by incrementing a value in the counter.

11. A component feeder comprising:
    a portable frame;
    a reel mounted on the portable frame, wherein the reel is adapted to contain a roll of tape and wherein components are mounted on the roll of tape;
    a component advancing mechanism mounted on the portable frame, wherein the component advancing mechanism is employed to advance the roll of tape, wherein the component advancing mechanism includes a stop point that is electrically isolated from other portions of the component advancing mechanism, wherein the component advancing mechanism shows a common electrical path with the portable frame, and wherein the in response to the component advancing mechanism advancing the tape, the component advancing mechanism contacts the stop point; and
    a counter mounted on the portable frame, wherein the counter contains a first contact electrically connected to the stop point and a second contact electrically connected to the portable frame, wherein the counter changes a value set in the counter in response to detecting a current transition caused by the component advancing mechanism contacting the stop point.

12. The component feeder of claim 11, wherein the counter counts the advancement of the roll of tape by incrementing a value in the counter.

13. The component feeder of claim 11, wherein the counter counts the advancement of the roll of tape by decrementing a value in the counter.

14. The component feeder of claim 13, wherein the value is initially set equal to the plurality of components on the roll of tape.

* * * * *